(12) United States Patent
Izumi et al.

(10) Patent No.: US 6,413,845 B1
(45) Date of Patent: Jul. 2, 2002

(54) METHOD FOR FABRICATING METAL INTERCONNECTIONS

(75) Inventors: Yoshihiro Izumi, Kashihara; Yoshimasa Chikama, Souraku-gun, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/547,297

(22) Filed: Apr. 11, 2000

(30) Foreign Application Priority Data

Apr. 13, 1999 (JP) .......................................... 11-105142
Jan. 17, 2000 (JP) ........................................ 2000-007788

(51) Int. Cl.[7] ......................................... H01L 21/4763
(52) U.S. Cl. ...................................... 438/597; 438/599
(58) Field of Search ........................... 438/597, 117, 438/617, 690–693, 599; 257/780, 781, 783, 784, 773

(56) References Cited

U.S. PATENT DOCUMENTS 5,495,667 A * 3/1996 Farnworth et al. ............ 29/843
6,125,196 A1 * 4/2001 Eldridge et al. ............ 257/784

OTHER PUBLICATIONS

M. Ikeda, et al. "Low Resistance Copper Address Line for TFT–LCD", Japan Display '89, pp. 498–501.

* cited by examiner

*Primary Examiner*—David Nelms
*Assistant Examiner*—Dung A Le
(74) *Attorney, Agent, or Firm*—Dike, Bronstein, Roberts & Cushman; David G. Conlin; David A. Tucker

(57) ABSTRACT

In the present method for fabricating metal interconnections, a Ni film is deposited on an insulating substrate by electroless plating, and a photoresist film is formed in a specified pattern on the Ni film. An Au film is deposited by electroless plating in a region where the Ni film is exposed and where the resist is not formed. The photoresist film is removed, and the Ni film exposed by the removal of the photoresist film is removed by etching. A Cu film is formed on the Au film by electroplating or electroless plating selectively. This method consists of only wet deposition process, involves less etching process and provides metal interconnections of low resistance.

16 Claims, 6 Drawing Sheets

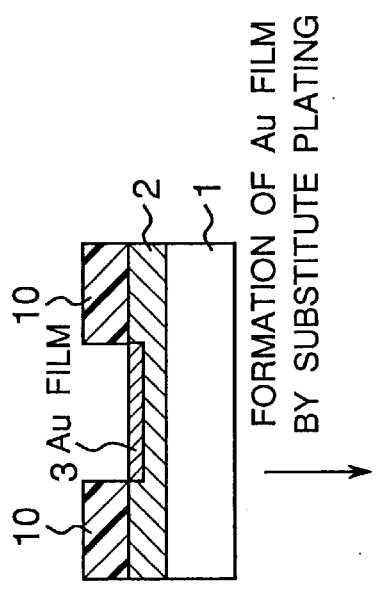
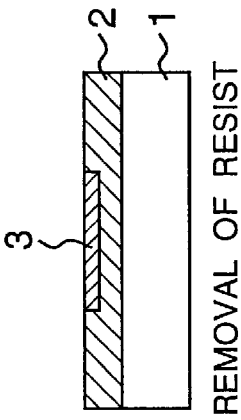
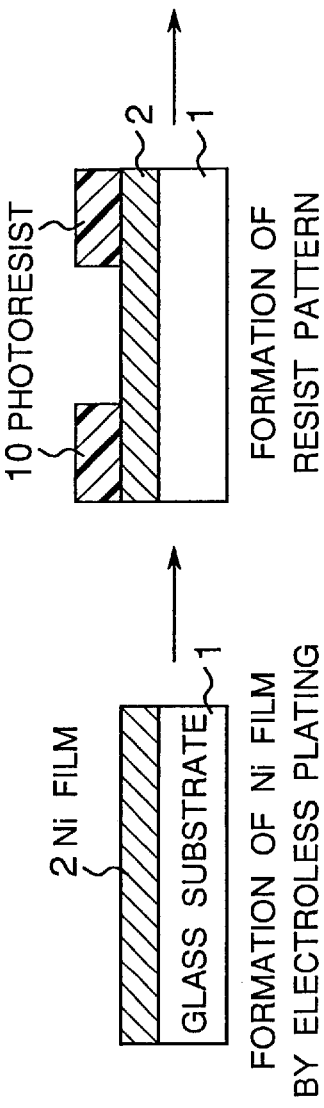
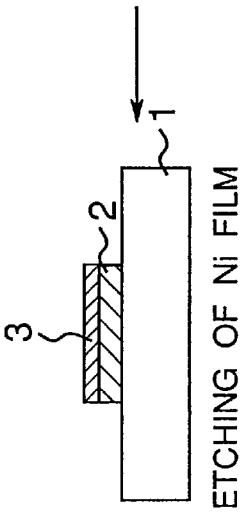
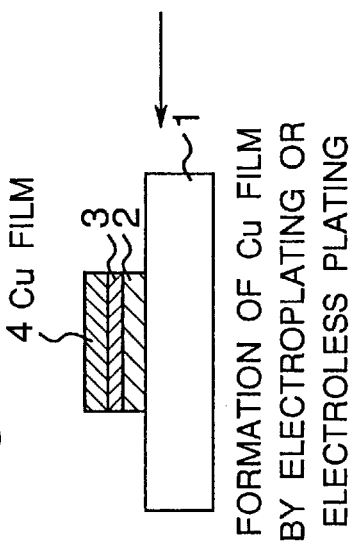

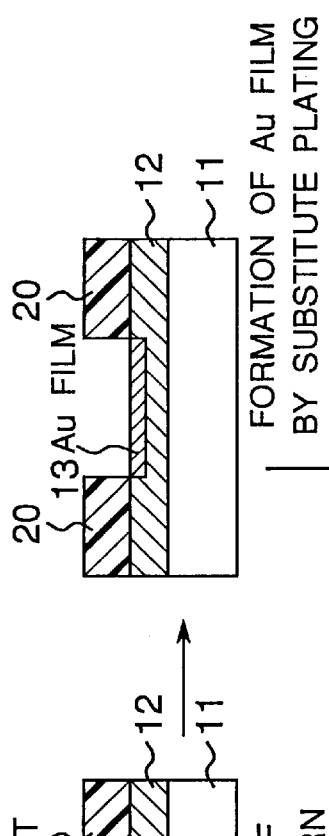
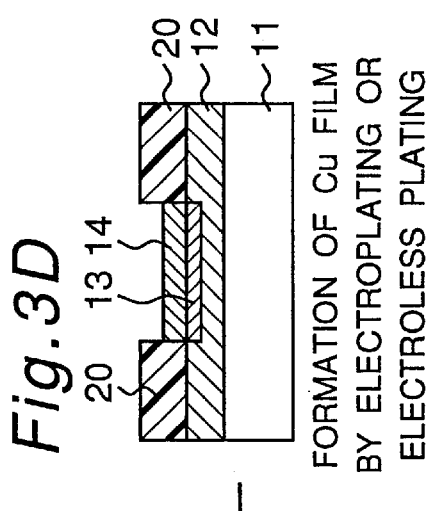
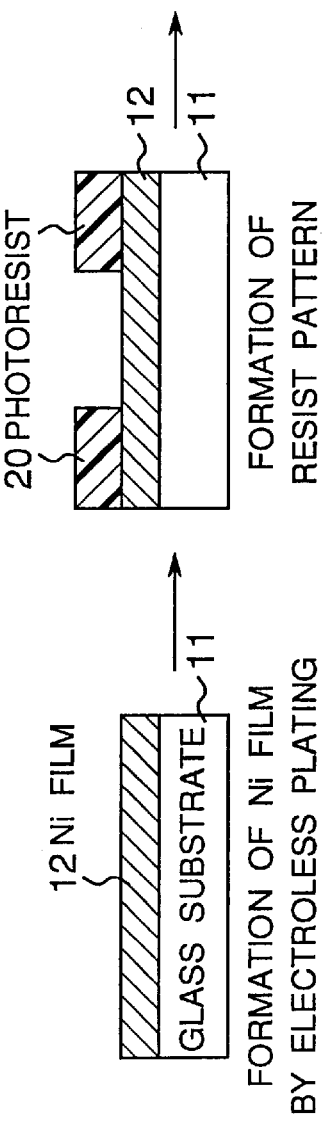
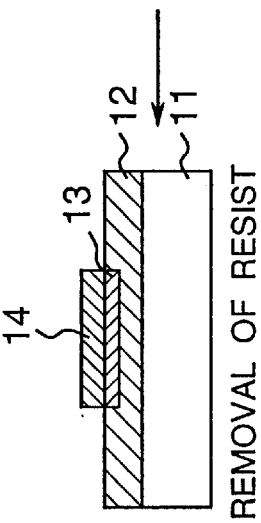
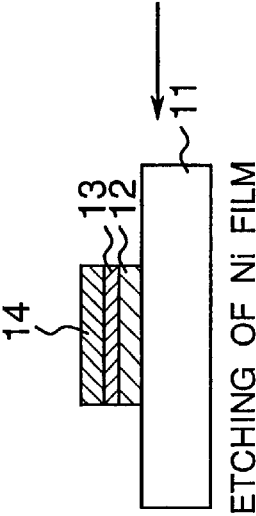

FORMATION OF Au/Ni FILM
ON Cu FILM BY ELECTROPLATING

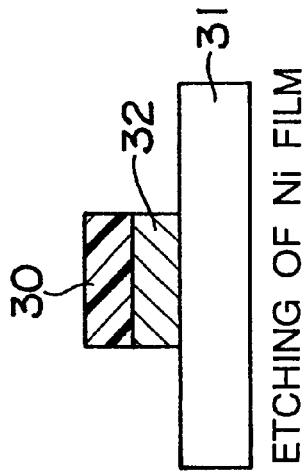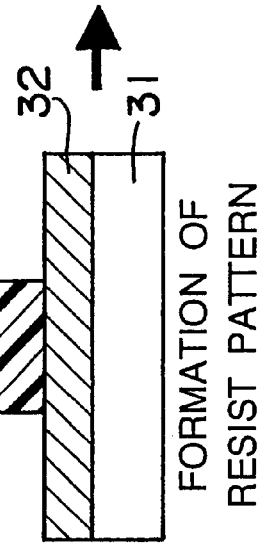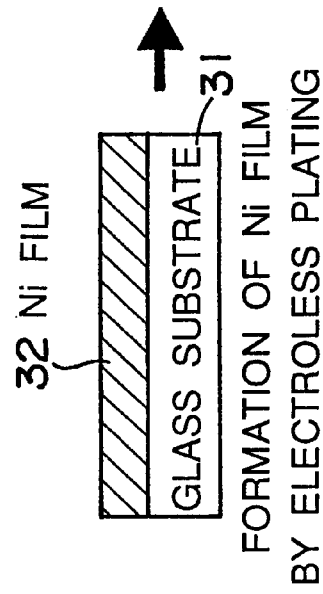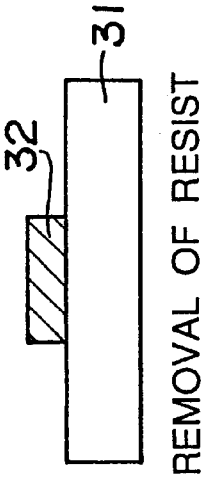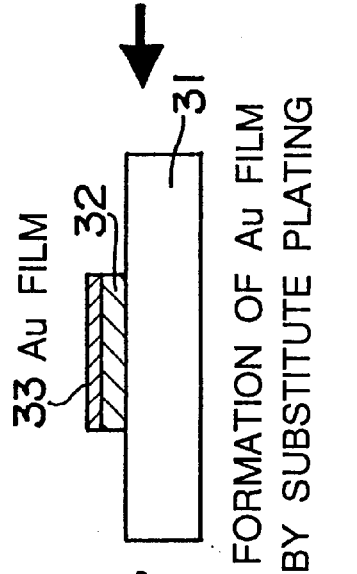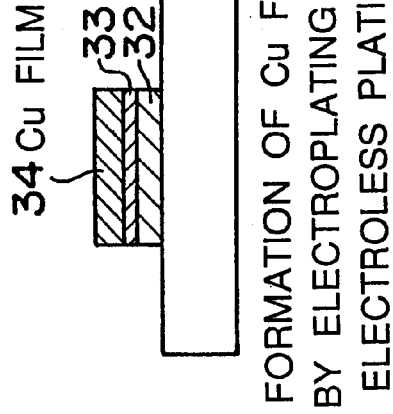

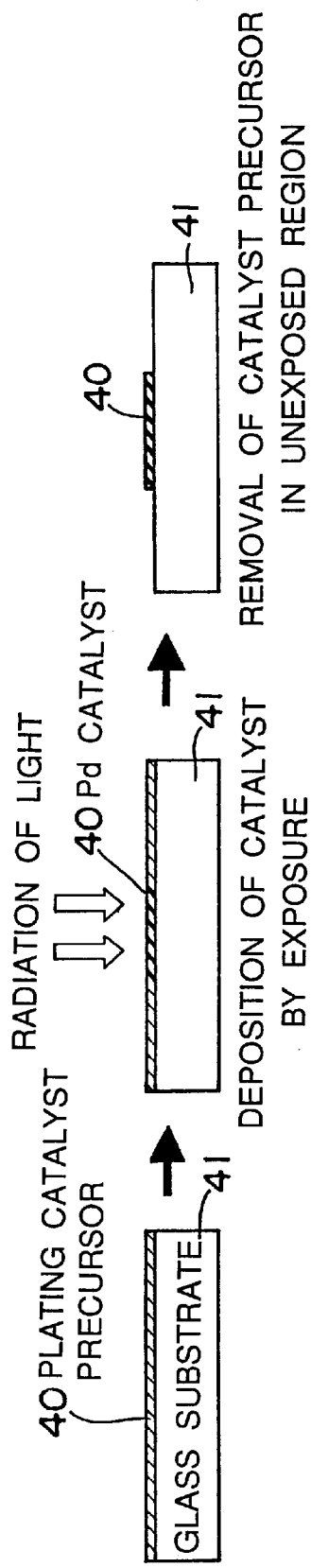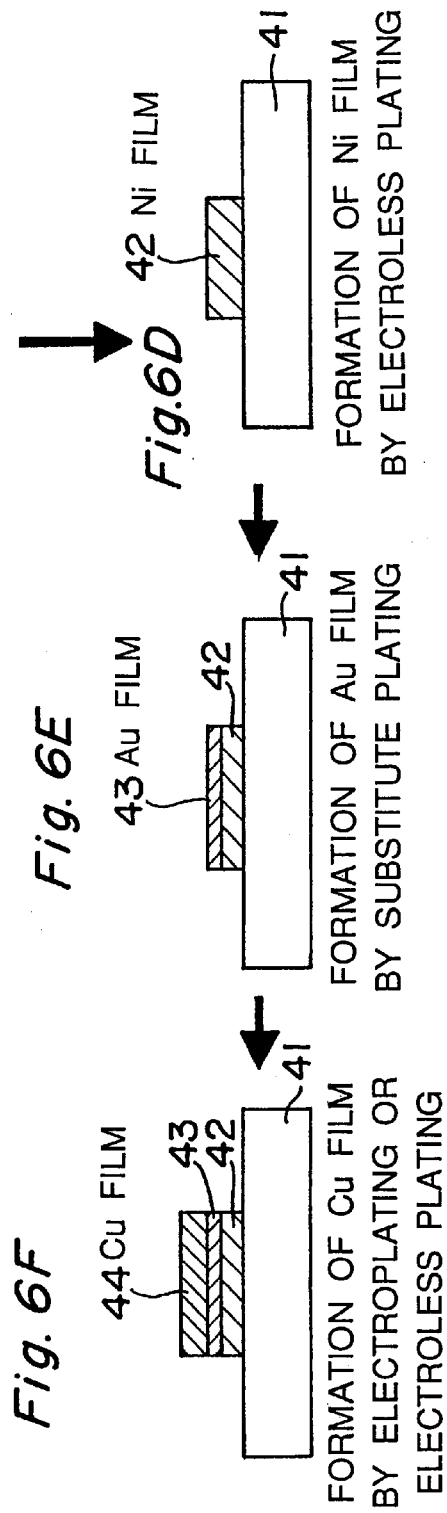

METHOD FOR FABRICATING METAL INTERCONNECTIONS

BACKGROUND OF THE INVENTION

The present invention relates to a method for fabricating metal interconnections used for flat panel displays such as liquid crystal displays (LCD), plasma display panels (PDP), electrochromic displays (ECD) and electroluminescent displays (ELD), or flat panel sensors such as X-ray imaging devices.

In a flat panel display typified by LCD, normally, display material such as liquid crystals or discharge gas is sandwiched between a pair of insulating substrates, and electrical interconnection lines are arrayed on at least one of the insulating substrates, where a voltage is applied to the display material via the electrical lines.

For example, in the case of an active matrix drive type LCD, a plurality of gate electrodes and a plurality of data electrodes are provided in a matrix shape on an active matrix substrate, which is one of the pair of insulating substrates between which the display material is sandwiched. At intersections of these gate electrodes and data electrodes, thin film transistors (TFT) and pixel electrodes are provided every intersection. Normally, these gate electrodes and data electrodes are made of metal material such as tantalum (Ta), aluminum (Al) or molybdenum (Mo), and deposited by dry deposition process such as sputtering process.

In such flat panel displays, in an attempt to implement larger areas and higher definitions, increased drive frequencies would cause the resistance of the electrical lines as well as the parasitic capacitance to increase. As a result of this, delay of driving signals would come up as a large problem.

Thus, in order to solve the problem of the delay of driving signals, there has been made an attempt to use Cu (copper, bulk resistivity: 1.7 $\mu\Omega\cdot$cm) having lower electrical resistance as the interconnection material, instead of Al (bulk resistivity: 2.7 $\mu\Omega\cdot$cm), $\alpha$-Ta (bulk resistivity: 13.1 $\mu\Omega\cdot$cm) or Mo (bulk resistivity: 5.8 $\mu\Omega\cdot$cm), which are conventional interconnection materials. For example, "Low Resistance Copper Address Line for TFT-LCD" (Japan Display '89, pp. 498–501) discloses discussion results on a case of using Cu as the gate electrode material of TFT-LCD (thin film transistor liquid crystal display). According to this literature, it is pointed out that because a Cu film deposited by sputtering process is poor in adhesion to the ground glass substrate, a ground metal film of Ta or the like needs to be interveniently provided between the ground glass substrate and the Cu film in order to enhance the adhesion to the ground glass substrate.

However, in the case of the interconnection structure shown in the above literature, separate deposition processes are involved for the Cu film and the ground metal film of Ta or the like, causing a process increase and leading to a cost increase, as a disadvantage.

Also, separate etching processes are involved for the Cu film and the ground metal film of Ta or the like, causing a process increase and leading to a cost increase, as a disadvantage.

SUMMARY OF THE INVENTION

An object of the present invention is to provide a method for fabricating metal interconnections of low resistance, the method consisting of only wet deposition process and involving less etching process.

In order to achieve the above object, in a first aspect of the invention, there is provided a method for fabricating metal interconnections, comprising: a first step for depositing a ground metal film on an insulating substrate by electroless plating; a second step for forming a resist in a specified pattern on the ground metal film; a third step for depositing a noble metal film by electroless plating in a region where the resist is not formed and where the ground metal film is exposed; a fourth step for removing the resist; a fifth step for removing, by etching, the ground metal film exposed by the removal of the resist; and a sixth step for forming a metal film by electroplating or electroless plating selectively on the noble metal film.

In a second aspect of the invention, there is provided a method for fabricating metal interconnections, comprising: a first step for depositing a ground metal film on an insulating substrate by electroless plating; a second step for forming a resist in a specified pattern on the ground metal film; a third step for depositing a noble metal film by electroless plating in a region where the resist is not formed and where the ground metal film is exposed; a fourth step for forming a metal film by electroplating or electroless plating selectively on the noble metal film; a fifth step for removing the resist; and a sixth step for removing, by etching, the ground metal film exposed by the removal of the resist.

In a third aspect of the invention, there is provided a method for fabricating metal interconnections, comprising: a first step for depositing a ground metal film on an insulating substrate by electroless plating; a second step for forming a resist in a specified pattern on the ground metal film; a third step for removing, by etching, the ground metal film present in a region where the resist is not formed; a fourth step for removing the resist; a fifth step for depositing a noble metal film by electroless plating selectively on the ground metal film exposed by the removal of the resist; and a sixth step for forming a metal film by electroplating or electroless plating selectively on the noble metal film.

In a fourth aspect of the invention, there is provided a method for fabricating metal interconnections, comprising: a first step for applying and forming a plating catalyst precursor on an insulating substrate; a second step for exposing to light the plating catalyst precursor in a specified pattern to form a plating catalyst into the specified pattern; a third step for removing the plating catalyst precursor in a region where the plating catalyst precursor is not exposed to light; a fourth step for depositing a ground metal film by electroless plating selectively on the patterned plating catalyst; a fifth step for depositing a noble metal film by electroless plating selectively on the ground metal film; and a sixth step for forming a metal film by electroplating or electroless plating selectively on the noble metal film.

According to the first to fourth aspects of the invention, the ground metal film, the noble metals and the metal films are all deposited by plating technique, which is a wet deposition technique. The wet deposition technique allows the equipment cost to be reduced because of its never using any evacuation system, as compared with the dry deposition technique.

Also, the wet deposition technique, in which film deposition is carried out in an aqueous solution, involves a deposition temperature as low as 100° C. or lower, thus reducing the energy consumption associated with film deposition, as compared with the dry deposition technique.

Further, the wet deposition technique, even with a large-size (large-area) substrate, involves less restrictions on equipment, as compared with the dry deposition technique, thus capable of easily achieving large-sized film deposition.

Also, according to the first to fourth aspects of the invention, the formation of resist pattern using photolithography has to be done only once in the second step, and the metal film etching also has to be done in the fifth step in the first aspect, the sixth step in the second aspect, or the third step in the third aspect. Further, in the fourth aspect of the invention, the metal film etching process is not necessary. Therefore, despite a stacked interconnection structure of a ground metal film, a noble metal film and a metal film, the fabrication process becomes simple, resulting in inexpensive interconnections.

Further, according to the first to fourth aspects of the invention, since a ground metal film superior in adhesion to the insulating substrate is interveniently provided between the insulating substrate and the metal film, the metal film can ensure a high adhesion to the insulating substrate.

Also, since a noble metal film of low electrical resistance is interveniently provided between the metal film and the ground metal film, current density required for plating can be uniformly distributed during the deposition of the metal film by electroplating. Therefore, a metal film uniform in film thickness can be obtained even with a large-area substrate.

Still further, according to the first to fourth aspects of the invention, since a noble metal film or metal film which is chemically stable and hard to pattern by etching is patterned by plating, an interconnection configuration can be easily formed.

In an embodiment of the first or second aspect of the invention, the electroless plating of the noble metal film in the third step is substitute plating for substituting the noble metal film for a surface of the ground metal film deposited in the first step.

In an embodiment of the third or fourth aspect of the invention, the electroless plating of the noble metal film in the fifth step is substitute plating for substituting the noble metal film for a surface of the ground metal film deposited in the first or fourth step.

According to these embodiments, since the electroless plating of the noble metal film is substitute plating for substituting the noble metal film for the surface of the ground metal film, the thickness of metallic deposit does not substantially vary before and after the electroless plating of the noble metal film. Further, since substitute reaction of the ground metal film and the noble metal film is used, there is no need for process of giving a catalyst such as Pd onto the ground metal film.

In an embodiment of the first aspect of the invention, in the fifth step of removing the ground metal film by etching, the noble metal film formed in the third step is used as an etching mask.

According to this embodiment, since the noble metal film formed in the third step and being very chemically stable is used as an etching mask without using photolithography process, the ground metal film can be patterned in self alignment.

In an embodiment of the second aspect of the invention, in the sixth step of removing the ground metal film by etching, the metal film deposited in the fourth step is used as an etching mask.

Therefore, according to this embodiment, the ground metal film can be patterned in self alignment by using the metal film as an etching mask without using photolithography process, and by selecting an etchant having a low etching rate for the metal film and a high etching rate for the ground metal film.

In an embodiment of the first to fourth aspects of the invention, the method for fabricating metal interconnections further comprises a seventh step for forming a surface metal film on the metal film in addition to the first to sixth steps.

According to this embodiment, since a surface metal film is formed on the metal film in the seventh step, the metal film is protected without being exposed to the atmosphere, so that the metal film can be prevented from oxidation.

In an embodiment of the first to fourth aspects of the invention, the ground metal film is formed of nickel.

According to this embodiment, since the ground metal film is formed of nickel, a high adhesion of the metal film to a glass substrate, which is typical of the insulating substrate, can be ensured.

In an embodiment of the first to fourth aspects of the invention, the noble metal film is formed of gold.

According to this embodiment, since the noble metal film is formed of gold, substitute plating for the ground metal film of nickel can be easy to achieve.

In an embodiment of the first to fourth aspects of the invention, the metal film is formed of copper.

According to this embodiment, inexpensive low-resistivity interconnections which are stable even with large current density can be implemented since the metal film is formed of copper, which is low in resistivity, long in life to electromigration and low in price.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A to 1F are process views showing a method for fabricating metal interconnections in an embodiment of the present invention;

FIGS. 3a to 3F are process views showing a method for fabricating metal interconnections in another embodiment of the present invention;

FIGS. 5A to 5F are process views showing a method for fabricating metal interconnections in still another embodiment of the present invention; and FIGS. 6A to 6F are process views showing a method for fabricating metal interconnections in yet another embodiment of the present invention.

DETAILED DESCRIPTION OF THE PREFERRED EMBODIMENTS

Figure 2:
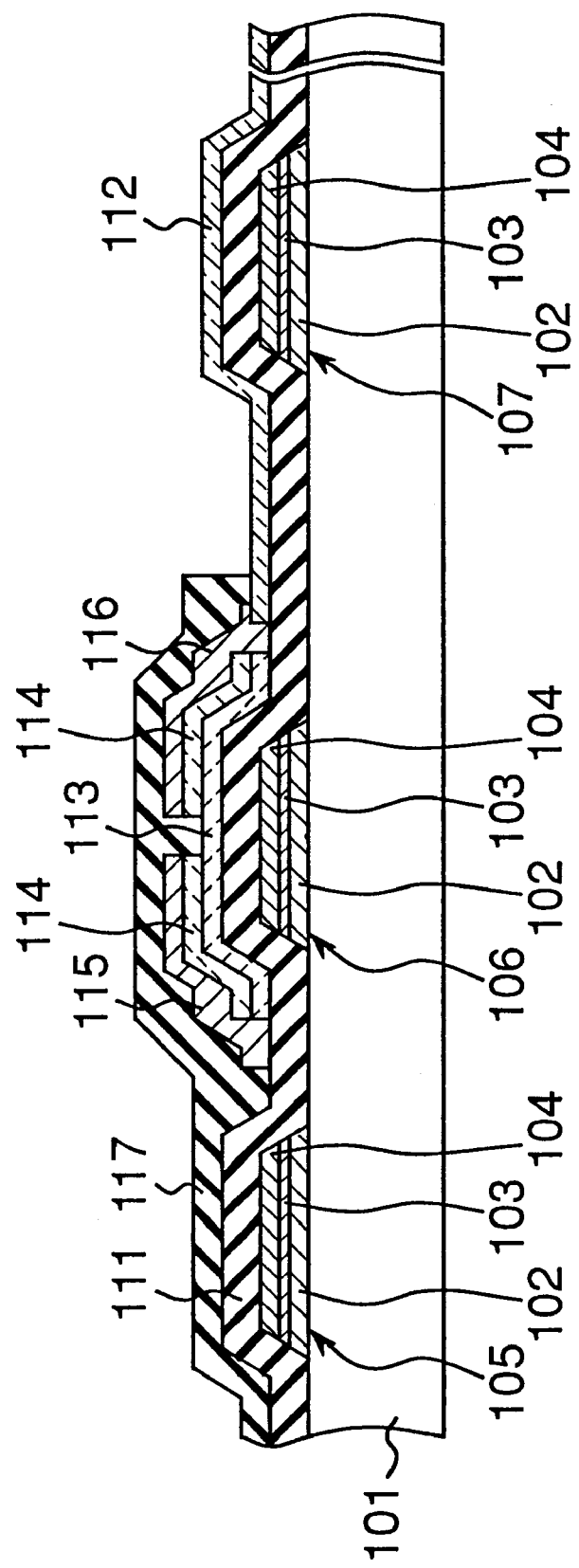
FIG. 2 is a sectional structural view of a thin film transistor and its vicinities by applying the method for fabricating metal interconnections shown in FIGS. 1A to 1F.

Hereinbelow, embodiments of the present invention are described with reference to the accompanying drawings. These embodiments are explained based on the assumption of an active matrix drive type liquid crystal display (LCD).
(Embodiment 1)

Embodiment 1 of the invention is constituted of first to sixth steps shown FIGS. 1A–1F, respectively.

At the first step shown in FIG. 1A, on a glass substrate 1 as an insulating substrate, is formed a nickel (Ni) film 2 as a ground metal film superior in adhesion to glass by electroless plating.

More specifically, at this first step, the glass substrate (e.g., #1737 made by Corning Inc.) 1 having a thickness of, for example, 0.7 mm is degreased and cleaned by alkali or acid or organic solvent so that dirties of surfaces of the glass substrate 1 are removed. In this process, by using ultrasonic cleaning in combination, dirties are removed efficiently. Next, the glass substrate 1 is dipped into the aqueous solution containing amino compounds, by which coating of amino compounds is formed on the surface of the glass substrate 1. This coating of amino compounds is extremely high in adhesion to the glass substrate 1 and has amino groups, so that palladium nuclei as the catalyst for plating are held successful. Subsequently, the glass substrate 1 is washed in water and then dipped into palladium chloride solution adjusted to a pH of about 5–8.5. Then the glass substrate 1 is washed in water again. Thereafter, the glass substrate 1 is dipped into an electroless plating solution, by which the Ni film 2 of 0.15–0.3 $\mu$m in thickness is formed on the glass substrate 1. The Ni film 2 obtained by electroless plating in this way is superior in adhesion to the glass substrate 1, and makes a ground layer (buffer layer) for a Au film 3 and a Cu film 4 which are fabricated in later process.

In addition, at the stage that the Ni film 2 has been formed, the Ni film 2 may also be subjected to an annealing process for about 1 hour at 200–300° C. so that the adhesion between the Ni film 2 and the glass substrate 1 is further improved.

This Ni film 2 formed in this step shows a resistivity of, for example, 50–60 $\mu\Omega\cdot$cm. This resistivity is one-order higher than that of pure Ni (6.8 $\mu\Omega\cdot$cm). The reason why the Ni film 2 shows such a resistivity is that the deposit film becomes amorphous eutectoid film of Ni—P or Ni—B by the effects of the reductant (sodium hypophosphite or dimethylaminoborane (DMAB), sodium borohydride (SBH)) to be used for the electroless plating. The resistivity of 50–60 $\mu\Omega\cdot$cm of the Ni film 2 is a value higher even compared with the resistivities of the $\alpha$-Ta, Al and Mo, which are interconnection materials obtained by conventional dry depositions. Therefore, it is hard to form metal interconnections for active matrix substrates by using only the Ni film 2 formed by this electroless plating.

Although palladium is used as the catalyst for electroless plating in this step, metals such as silver (Ag), platinum (Pt), zinc (Zn), copper (Cu) and nickel (Ni) in addition to palladium (Pd) as well as their alloys, metal compounds, or alloys in which these metals are alloyed into other metals at certain ratios, such as palladium-copper base, palladium-tin (Sn) base, silver-tin base and silver-copper base alloys may be used.

The electroless plating solution is one containing nickel salt and reductant. This reductant is exemplified by sodium hypophosphite, sodium hydrogen sulfite, sodium hyposulfite, sodium borohydride (SBH), dimethylaminoborane (DMAB), formalin, hydrazine and the like. Further, as required, accelerant, surfactant, pH regulator, stabilizer, pH buffer and the like are added to the electroless plating solution.

The ground metal film is not necessarily limited to nickel, and may be any metal capable of constituting a ground metal film. That is, an electroless plating solution containing metal salts capable of constituting the ground metal film may be used by selecting from among known electroless plating solutions. For example, electroless plating solutions containing metal salts of cobalt (Co), tin, gold, copper, silver, palladium and the like are usable.

At the second step shown in FIG. 1B, a photoresist film 10 is formed on the Ni film 2 in correspondence to interconnecting portions.

More specifically, first, on the Ni film 2 formed at the first step, photosensitive photoresist (e.g., OFPR-800 made by Tokyo Oka Kogyo Co.) is applied uniformly by spin coater process. Next, the applied photoresist is dried for 20 minutes at 90° C., by which an about 1 $\mu$m thick photoresist film 10 is formed on the Ni film 2. A photomask (not shown) having a specified interconnection configuration is set at a specified position on the photoresist film 10, and then the photoresist film 10 is exposed to light via the photomask. Thereafter, the photoresist film 10 is developed with an alkali developer and dried for 20 minutes at 120° C. Thus, a patterned photoresist film 10 having an opening at a region corresponding to the interconnection is formed.

In addition, the insulative photoresist to be used may be selected from among known various kinds of photoresists as required.

At the third step shown in FIG. 1C, the Au film 3 as a noble metal film is formed by electroless plating at the opening portion of the photoresist film 10, i.e., on the exposed Ni film 2. In this way, by the patterned photoresist film 10, the Au film 3 is selectively deposited on the Ni film 2.

This Au film 3 is provided substantially for the purpose of lowering the resistance of the Ni film 2. By the presence of this Au film 3, the Cu film 4 as a metal film can be deposited easily by electroplating in later process. That is, the Au film 3 used here is required to have such a level of resistance as uniform current density can be obtained by electroplating process at a later step. In more detail, the sheet resistance value of the Au film 3 is appropriately set to 1 $\Omega/\Box$ (ohm per square).

For this electroless plating of the Au film 3, substitute plating in which deposition is done by substituting the Au film 3 for part of the Ni film 2 is performed on the ground that the substitute plating is superior in adhesion to the Ni film 2 and capable of forming the Au film 3 only in the region where the photoresist film 10 is absent and where the Ni film 2 is exposed.

As the electroless plating solution, non-cyanic plating solutions are preferable rather than cyanic plating solutions, because the non-cyanic plating solutions have less effect on working environment or the photoresist film 10.

In addition, the thickness of the Au film 3 is preferably not less than 0.03 $\mu$m because 0.03 $\mu$m or less thicknesses would make it impossible to lower the resistance of the Ni film 2 enough.

In the case of substitute plating, if the Au film 3 is deposited to about 0.1 $\mu$m so as to fully cover the ground Ni, then the plating solution does not penetrate any more, so that the film thickness cannot be increased any more. Further, because thickening the Au film would make a factor of cost increase, the thickness of the Au film 3 is preferably not more than 0.1 $\mu$m. Consequently, about 0.03 $\mu$m–0.1 $\mu$m thicknesses are used as the thickness of the Au film 3.

At the fourth step shown in FIG. 1D, the photoresist film 10 is removed by alkali aqueous solution, ketones such as acetone, aromatics such as benzene, alcohols such as isopropyl alcohol, or the like. In this case, using ultrasonic waves in combination at such an intensity as the Ni film 2 is not stripped off, the removal of the photoresist film 10 can be effectively achieved.

At the fifth step shown in FIG. 1E, with the Au film 3 used as a mask, the Ni film 2 is removed by etching. By this removal of the Ni film 2 with the Au film 3 used as a mask, an interconnection pattern of a stacked structure of the Ni film 2 and the Au film 3 can be formed on the glass substrate 1.

For the etching of the Ni film 2, an appropriate etchant (reaction seed), such as commercially available Ni strippers, may be used.

In the sixth step shown in FIG. 1F, with a view to further lowering the resistance of interconnections, the Cu film 4 is formed on the stacked films of the Au film 3 and the Ni film 2 formed into the interconnection pattern by performing electroplating.

For the formation of this Cu film 4, a specified current is passed through the stacked films of the Ni film 2 and the Au film 3 in an electrolytic solution containing Cu, and then an electrodeposit of the Cu film 4 is formed on the Au film 3. The thickness of this Cu film 4 can be optionally set by controlling the conducting time. Accordingly, by controlling the conducting time so that a required interconnection sheet resistance can be obtained, the thickness of the Cu film 4 can be controlled. The stacked films of the Ni film 2 and the Au film 3 have a sheet resistance of not more than 1 Ω/□ by the presence of the Au film 3. Therefore, current density distribution within the plane of the glass substrate 1 can be made relatively uniform, so that variations of the film thickness can be suppressed to about 30% even with an about 50 cm square glass substrate 1.

Particularly for interconnections dedicated to active matrix drive type LCD, Cu is most suitable as the material for the viewpoints of material cost, resistance value, electromigration resistance and the like, where forming a 0.2–0.5 μm thick film allows sufficiently low resistance interconnections to be obtained.

Although the low resistance of interconnections can be fulfilled also by only the Au film 3, which is a noble metal film, yet forming a thick Au film would lead to a cost increase. Therefore, it is desirable to form the Au film 3 as thin as possible, and to form a Cu or other inexpensive low-resistance metal film thereon with a view to lowering the resistance.

In addition, for the Cu film 4 in this step, electroplating is adopted because electroplated film can be formed more compact in film quality and lower in resistance. However, the Cu film 4 can be formed selectively on the Au film 3 also by electroless plating. In the case where the Cu film 4 is formed by electroless plating, the ground Au film 3 is not required to be low in electrical resistance and therefore may be less than 0.03 μm thick. Whether electroplating or electroless plating is used may be selected depending on required film-quality performance. In addition, as the metal material to be deposited by the electroplating, nickel, tin, gold, silver, chromium, palladium, rhodium, tin-lead, and the like as well as copper are available.

As described above, by the method for fabricating metal interconnections through the first to sixth steps, all of the Ni film 2, the Au film 3 and the Cu film 4 can be deposited by plating technique, what is called, wet deposition technique.

The wet deposition technique is lower in equipment cost by virtue of its not using any evacuation system, as compared with the conventional dry deposition technique.

Also, since the film deposition is carried out in aqueous solution, the deposition temperature is as low as 100° C. or lower, so that less energy consumption is involved in film deposition.

Further, the wet deposition technique has an advantage that film deposition can be easily achieved even with a larger-size (larger-area) insulating substrate.

Besides, in Embodiment 1, photolithography process has to be performed only once at the second step, and etching process also has to be performed only once at the fifth step. Therefore, the fabrication process becomes quite simple despite a layered interconnection structure of the Ni film 2, the Au film 3 and the Cu film 4, which leads to a low-cost interconnection fabricating method.

Further, in the above steps, even a noble metal film and a metal film, which are difficult to pattern by etching, can be easily patterned into an interconnection configuration without using etching technique. For example, Au, which is chemically stable, or Cu, which is hard to process by dry etching, can be easily used as an interconnection material.

In particular, Cu is low in resistivity and long in life against electromigration, thus optimal as the interconnection material. Cu interconnections, when implemented by the above process, make it easier to obtain higher definitions and larger areas of displays.

Also in the above steps, even if the material of the metal film is given by one having a poor adhesion to the insulating substrate, a ground metal film superior in adhesion to the insulating substrate is interveniently provided between the insulating substrate and the metal film, and makes it easier to ensure the adhesion.

Also, since a noble metal film is interveniently provided between the metal film and the ground metal film, the current density distribution can be made uniform even in the deposition of the metal film by electroplating, thus making it possible to obtain a metal film uniform in film thickness even with a large-area substrate.

FIG. 2 shows a sectional structural view of a thin film transistor (TFT) and its vicinities in the case where metal interconnections obtained by the fabrication process of FIGS. 1A–1F are adopted in an active matrix substrate as an application example of Embodiment 1. As can be understood from FIG. 2, on a glass substrate 101, stacked films formed of a Ni film (about 0.2 μm thick) 102 as a ground metal film, a Au film (about 0.05 μm thick) 103 as a noble metal film and a Cu film (about 0.3 μm thick) 104 as a metal film are provided, and these stacked films are used as a gate interconnection 105, a gate electrode 106 and a Cs electrode 107. The sheet resistance of the stacked films is not more than 0.1 Ω/□.

Further, on the gate interconnection 105, the gate electrode 106 and the Cs electrode 107, a gate insulator 111 made of SiNx is formed by chemical vapor deposition (CVD) process. On the gate insulator 111 just over the gate electrode 106, an a-Si film 113 as a channel portion is provided. Also in adjacency to this a-Si film 113, a pixel electrode 112 of indium oxide (ITO) is provided. On right and left of the a-Si film 113, an n+ type a-Si film 114 is provided as a contact layer. On the n+ type a-Si film 114, are provided a source electrode 115 and a drain electrode 116 made of Al, respectively. On the source electrode 115 and the drain electrode 116, an insulating protective film 117 made of SiNx is provided.

The TFT device obtained in this way showed characteristics generally similar to those of conventional TFT devices using gate interconnections formed by dry deposition. Thus, it was verified that this invention is applicable to active matrix drive type LCD.

Although FIG. 2 shows an example in which the source electrode 115 and the drain electrode 116 are formed of Al, the source electrode and the drain electrode may also be formed of plated films of Ni, Cu or the like. In this case, all the metal interconnections used for the TFT device are formed by the wet deposition technique. When all the metal interconnections are formed by the wet deposition technique, TFT can be fabricated by a fabrication process low in cost and less in power consumption.

Also, although FIG. 2 shows a TFT of the inverted staggered structure (bottom gate structure) in which the gate electrode 106 is located below, yet the invention may also be applied to a TFT of the staggered structure (top gate structure) in which the gate electrode is located above.

(Embodiment 2)

Embodiment 2 is another fabrication method for obtaining interconnections of the same structure as the metal interconnections described in Embodiment 1.

FIGS. 3A–3F show first to sixth steps of Embodiment 2, respectively. The first to third steps of Embodiment 2 shown in FIGS. 3A–3C are the same as the first to third steps of Embodiment 1 shown FIGS. 1A–1C, respectively.

In detail, at the first step shown in FIG. 3A, on a glass substrate 11 which is an insulating substrate, is formed a nickel film 12 as a ground metal film superior in adhesion to glass by electroless plating. At the second step shown in FIG. 3B, a photoresist film 20 is formed on the Ni film 12 in correspondence to interconnecting portions. Then, at the third step shown in FIG. 3C, a Au film 13 which is a noble metal film is formed by electroless plating at an opening portion of the photoresist film 20, i.e., on the exposed Ni film 12. As in Embodiment 1, the thickness of the nickel film 12 is 0.15–0.3 $\mu$pm, and the thickness of the Au film 13 is set to 0.03–0.1 $\mu$m. In this case, the sheet resistance of the stacked films of the nickel film 12 and the Au film 13 is not more than 1 $\Omega/\square$.

At the fourth step shown in FIG. 3D, electroplating of Cu is performed on the Au film 13 patterned into the interconnection configuration in order to achieve a low resistance of interconnections. In this case, because only the Au film 13 formed at the opening portion of the photoresist film 20 is exposed, Cu electroplating is possible only on the exposed Au film 13. The thickness of this Cu film 14 can be optionally set by controlling the conducting time. That is, the film thickness of the Cu film 14 may be controlled so that a required interconnection sheet resistance can be obtained. In this case, the stacked films of the Ni film 12 and the Au film 13 have a sheet resistance of not more than 1 $\Omega/\square$ by the presence of the Au film 13. Therefore, current density distribution within the plane of the glass substrate 11 can be made relatively uniform, so that variations of the thickness of the Cu film 14 can be suppressed to about 30% even with an about 50 cm square insulating substrate.

In addition, although the Cu film 14 can be formed selectively on the Au film 13 also by electroless plating, yet electroplating is adopted for the Cu film 14 in this step because electroplated film can generally be formed more compact in film quality and lower in resistance. Whether electroplating or electroless plating is used may be selected depending on required performance.

As the metal material to be deposited by the electroplating, nickel, tin, gold, silver, chromium, palladium, rhodium, tin-lead, and the like as well as copper are available.

In the case of metal interconnections dedicated to active matrix drive type LCD, electroplating or electroless plating of Cu is most suitable from the viewpoints of material cost, resistance value, electromigration resistance and the like, where forming a 0.2–0.5 $\mu$m thick Cu film for use as interconnections allows sufficiently low resistance interconnections to be obtained.

Next, at the fifth step shown in FIG. 3E, the photoresist film 20 of FIG. 3D is removed by alkali aqueous solution, ketones such as acetone, aromatics such as benzene, alcohols such as isopropyl alcohol, or the like. In this case, using ultrasonic cleaning in combination at such an intensity as the Ni film 12 is not stripped off, the removal of the photoresist film 20 can be effectively achieved.

Thereafter, at the sixth step shown in FIG. 3F, with the Cu film 14 used as a mask, the Ni film 12 is removed by etching, by which an interconnection pattern of a stacked structure of the Ni film 12, the Au film 13 and the Cu film 14 can be formed on the glass substrate 11.

In this case, using an etchant having an etching selectivity for the Cu film 14 and the nickel film 12 of upper layers, i.e., using an etchant having a low etching effect on the Cu film 14 and a large etching effect on the nickel film 12, makes it possible to remove only the nickel film 12 with the Cu film 14 used as a mask. As the etchant, for example, commercially available Ni strippers that hardly etch Cu may be used. In addition, the Au film 13, which is a noble metal, is quite difficult to etch, thus making no obstacle to removing only the nickel film 12.

(Embodiment 3)

Embodiment 3 is another method for obtaining interconnections of the same structure as the metal interconnections described in Embodiment 1.

FIGS. 5A–5F show first to sixth steps of Embodiment 2, respectively.

In detail, at the first step shown in FIG. 5A, on a glass substrate 31 which is an insulating substrate, is formed a nickel film 32 as a ground metal film superior in adhesion to glass by electroless plating. The method of electroless Ni-plating, the thickness of the Ni film and the like are the same as in foregoing Embodiment 1. At the second step shown in FIG. 5B, a photoresist film 30 is formed on the Ni film 32 in correspondence to interconnecting portions. The method of forming the photoresist film 30 is the same as in foregoing Embodiment 1. However, in this embodiment, a patterned photoresist film 30 is formed in a region corresponding to the interconnecting portion. Then, at the third step shown in FIG. 5C, an opening portion of the photoresist film 30, i.e., the exposed Ni film 32 is removed by etching with a Ni etchant. Subsequently, at the fourth step shown in FIG. 5D, photoresist is removed. At this stage, an interconnection pattern of the Ni film 32 is formed on the glass substrate 31.

At the fifth step shown in FIG. 5E, a Au film 33 which is a noble metal film is formed by electroless substitute plating on the Ni film 32 patterned into the interconnection configuration. In this case, because substitute plating is used, the Au film 33 is selectively deposited only at portions where the Ni film 32 is present. In addition, as in Embodiment 1, the thickness of the Ni film 32 is 0.15–0.3 $\mu$m, and the thickness of the Au film 33 is set to 0.03–0.1 $\mu$m. In this case, the sheet resistance of the stacked films of the nickel film 32 and the Au film 33 is not more than 1 $\Omega/\square$.

In the sixth step shown in FIG. 5F, with a view to further lowering the resistance of interconnections, electroplating of Cu is performed on the Au film 33 patterned into the interconnection configuration. In this case, because the electroplating is performed on the Au/Ni film which has already been patterned into the interconnection configuration, a Cu film 34 is deposited only on the Au/Ni film. The thickness of this Cu film 34 can be set optionally by controlling the conducting time. That is, the film thickness of the Cu film 34 may be controlled so that a required interconnection sheet resistance can be obtained In addition, although the Cu film 34 can be formed selectively on the Au film 33 also by electroless plating, yet electroplating is adopted for the Cu film 34 in this step because electroplated film can generally be formed more compact in film quality and lower in resistance. In the case of electroless plating, on the other hand, because plating can be performed without passing a current through the interconnections, there are some advantages that uniform film thickness can be obtained in this plating process even with a larger substrate area, and that the plating can be achieved also with an island-like independent interconnection pattern. By taking into consideration these features, whether electroplating or electroless plating is used may be selected depending on required performance.

Thus, the method for fabricating metal interconnections of this Embodiment 3 is capable of obtaining the same effects as in Embodiment 1.

(Embodiment 4)

Embodiment 4 is a method for obtaining interconnections of the same structure as the metal interconnections described in Embodiment 1.

FIGS. 6A–6F show first to sixth steps of Embodiment 4, respectively.

At the first step shown in FIG. 6A, a plating catalyst precursor 40 is applied to and formed on a glass substrate 41 which is an insulating substrate. As the plating catalyst precursor 40, for example, a photosensitive material containing a metal serving as a catalyst, its compounds, ions, colloids and the like can be used. At the second step shown in FIG. 6B, the plating catalyst precursor 40 is exposed with ultraviolet radiation or the like in a pattern corresponding to the interconnection configuration. By this exposure, the plating catalyst precursor 40 induces a chemical reaction, so that the plating catalyst is deposited only in the exposed region. Then, at the third step shown in FIG. 6C, the plating catalyst precursor 40 of the unexposed region is removed.

The above first to third steps are explained more concretely below. As the plating catalyst precursor 40, one obtained by dissolving palladium acetylacetonato into an organic solvent of chloroform is used. This photosensitive catalyst solution is applied onto the glass substrate 41 by spin process or the like (first step). Then, with ultraviolet radiation via a photomask, a metal of Pd is deposited on the base material only in the exposed region (second step). Thereafter, in developing process, the photosensitive film in the unexposed region is washed away by the organic solvent of chloroform or the like, by which a pattern of the remaining Pd can be formed (third step). Instead of this, it is also possible to use a photosensitive catalyst solution obtained by dissolving ferric oxalate and palladium chloride into a potassium hydroxide, or photosensitive catalyst solution containing an oxalate such as ferric oxalate or ruthenium oxalate, palladium chloride and aqueous ammonia. In this case, it is also effective to add hydrophilic binder such as polyvinyl alcohol or the like to the aforementioned photosensitive catalyst solution so that the photosensitive catalyst solution can be applied onto the substrate uniformly. Further, there is a method in which Ag is selectively deposited by using reduction reaction of Ag ions with ultraviolet radiation. There is a still further method in which pattern formation is performed through coating, exposure and development steps by using a material in which a metal serving as a catalyst, its compounds, ions, colloids or the like are dispersed in a photosensitive resin such as photoresist containing.

Subsequently, at the fourth step shown in FIG. 6D, a Ni film 42 as a ground metal film is formed by electroless plating in the region where the plating catalyst is present on the glass substrate. The Ni deposit can be deposited selectively into an interconnection configuration in correspondence to the pattern of the plating catalyst.

At the fifth step shown in FIG. 6E, a Au film 43 which is a noble metal film is formed by electroless substitute plating on the Ni film 42 patterned into the interconnection configuration. In this case, because substitute plating is used, the Au film 43 is selectively deposited only at portions where the Ni film 42 is present. In addition, as in Embodiment 1, the thickness of the Ni film 42 is 0.15–0.3 $\mu$m, and the thickness of the Au film 43 is set to 0.03–0.1 $\mu$m. In this case, the sheet resistance of the stacked films of the Ni film 42 and the Au film 43 is not more than 1 $\Omega/\square$.

In the sixth step shown in FIG. 6F, with a view to further lowering the resistance of interconnections, electroplating of Cu is performed on the Au film 43 patterned into the interconnection configuration. In this case, because the electroplating is performed on the Au/Ni film which has already been patterned into the interconnection configuration, a Cu film 44 is deposited only on the Au/Ni film. The thickness of this Cu film 44 can be set optionally by controlling the conducting time. That is, the film thickness of the Cu film 44 may be controlled so that a required interconnection sheet resistance can be obtained.

In addition, although the Cu film 44 can be formed selectively on the Au film 43 also by electroless plating, yet electroplating is adopted for the Cu film 44 in this step because electroplated film can generally be formed more compact in film quality and lower in resistance. In the case of electroless plating, on the other hand, because plating can be performed without passing a current through the interconnections, there are some advantages that uniform film thickness can be obtained in this plating process even with a larger substrate area, and that the plating can be achieved also with an island-like independent interconnection pattern. By taking into consideration these features, whether electroplating or electroless plating is used may be selected depending on required performance.

Thus, the method for fabricating metal interconnections of this Embodiment 4 is capable of obtaining the same effects as in Embodiment 1 and fabricating metal interconnections even more simply because etching process for metal films is unnecessary.

(Embodiment 5)

A method for fabricating metal interconnections in Embodiment 5 is characterized by comprising an additional step for further forming a surface metal film by electroplating or electroless plating on the surface of metal films for metal interconnections, where the metal films have a stacked-layer structure of the ground metal film (Ni film), the noble metal film (Au film) and the metal film (Cu film) obtained in Embodiments 1 to 4. As a result of this, the surface metal film prevents the metal films from making direct contact with the atmospheric air and can prevent oxidation as a productive layer for the metal films.

Figure 4:
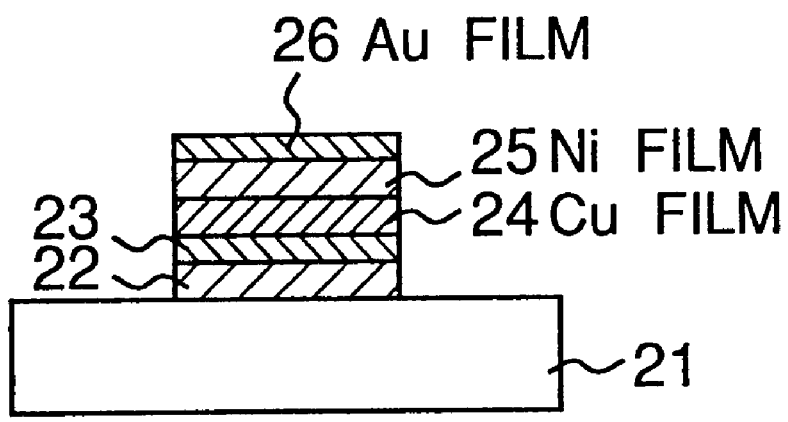
FIG. 4 is a view showing a method for fabricating metal interconnections in which surface metal films are formed in still another embodiment of the present invention.

For example, metal interconnections of a stacked structure of a Ni film 22, a Au film 23 and a Cu film 24 is formed on an insulating substrate 21 in the same way as in Embodiments 1 to 4, and this insulating substrate 21 with metal interconnections formed thereon is dipped into an aqueous solution containing an electroless plating catalyst and then further dipped into an electroless plating solution. As a result of this, the catalyst is substituted only on the Cu film 24, by which metals are deposited only in this portion, and thus a Ni film 25 and a Au film 26, which are surface metal films, are formed as shown in FIG. 4. As such surface metal films, not only nickel and gold but also palladium, chromium or other surface metal films may also be formed.

The formation of surface metal films in this step is especially effective in the case where Cu, in particular, is used as the metal film. The reason of this is that Cu is liable to oxidation and to be fully oxidized up to the film interior, whereas the above surface metal films can play a role of oxygen shut-off films. In addition, even with Cu used as the metal film, in the case where the method further comprises a step for coating Cu with organic film at its surface immediately after the deposition of Cu and removing the organic film immediately before the succeeding step, or a step for covering the metal films with non-oxide of surface SiNx or the like immediately after the deposition of Cu, it is enabled to prevent the oxidation of the metal films even without any surface metal films.

(Embodiment 6)

A method for fabricating metal interconnections in this embodiment is capable of forming metal interconnections on a transparent electrode formed in an insulating substrate.

For example, at the first step in Embodiments 1 to 3, first, a ground metal film is formed by electroless plating selectively over a transparent electrode formed into a specified pattern on the insulating substrate. The transparent electrode is formed of a transparent conductive substance such as indium oxide (ITO), tin oxide ($SnO_2$) or the like.

As an example of the formation of a ground metal film on the transparent electrode by electroless plating, first, the insulating substrate is subject to alkali cleaning with sodium hydroxide or the like (in combination with ultrasonic cleaning) and degreasing process (in combination with ultrasonic cleaning), and washed with water. Thereafter, the substrate is dipped into a solution containing fluorides so that the transparent electrode is surface roughened. After washed with water, the substrate is dipped into a palladium chloride solution so that the pH is adjusted to about 5–8.5, thereby activated, and then washed with water. As a result of this, palladium nuclei that make the catalyst for electroless plating are selectively deposited only on the transparent electrode.

After that, the substrate is dipped into an electroless plating solution so that metals are deposited, by which a ground metal film is formed. As the ground metal film, Ni is preferable by virtue of its good adhesion to the transparent electrode (ITO).

By forming metal interconnections explained in Embodiments 1 to 3 on an insulating substrate having a transparent electrode as described above, lower resistance of the transparent electrode can be implemented with the metal interconnections provided only in part of the transparent electrode, in addition to the effects described in Embodiments 1 to 3. Thus, there can be produced an advantage effective for implementing lower resistance of the transparent electrode in passive matrix drive type LCD, plasma displays, EL displays and the like. Further, it is also possible, of course, to add surface metal films as required like Embodiment 5.

The invention is quite effective for cases where use of Cu is demanded for lower resistance of interconnections, or where the formation of interconnections by wet deposition instead of dry deposition.

The above embodiments of the present invention have been described with a limitation to the method for fabricating metal interconnections for use in flat panel displays. However, without being limited to this, the method of the invention can be widely applied as methods for fabricating metal interconnections in other fields. For example, the method can be applied to flat panel type X-ray imaging devices using an active matrix substrate and so on.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A method for fabricating metal interconnections, comprising:

a first step for depositing a ground metal film on an insulating substrate by electroless plating;

a second step for forming a resist in a specified pattern on the ground metal film;

a third step for depositing a noble metal film by electroless plating in a region where the resist is not formed and where the ground metal film is exposed;

a fourth step for removing the resist;

a fifth step for removing, by etching, the ground metal film exposed by the removal of the resist; and a sixth step for forming a metal film by electroplating or electroless plating selectively on the noble metal film.

2. The method for fabricating metal interconnections according to claim 1, wherein the electroless plating of the noble metal film in the third step is substitute plating for substituting the noble metal film for a surface of the ground metal film deposited in the first step.

3. The method for fabricating metal interconnections according to claim 1, wherein in the fifth step of removing the ground metal film by etching, the noble metal film formed in the third step is used as an etching mask.

4. The method for fabricating metal interconnections according to claim 1, further comprising:

a seventh step for forming a surface metal film on the metal film in addition to the first to sixth steps.

5. The method for fabricating metal interconnections according to claim 1, wherein the ground metal film is formed of nickel.

6. The method for fabricating metal interconnections according to claim 1, wherein the noble metal film is formed of gold.

7. The method for fabricating metal interconnections according to claim 1, wherein the metal film is formed of copper.

8. An active matrix board comprising metal interconnections formed by using the fabrication method according to claim 1.

9. A method for fabricating metal interconnections, comprising:

a first step for depositing a ground metal film on an insulating substrate by electroless plating;

a second step for forming a resist in a specified pattern on the ground metal film;

a third step for depositing a noble metal film by electroless plating in a region where the resist is not formed and where the ground metal film is exposed;

a fourth step for forming a metal film by electroplating or electroless plating selectively on the noble metal film;

a fifth step for removing the resist; and a sixth step for removing, by etching, the ground metal film exposed by the removal of the resist.

10. The method for fabricating metal interconnections according to claim 9, wherein the electroless plating of the noble metal film in the third step is substitute plating for substituting the noble metal film for a surface of the ground metal film deposited in the first step.

11. The method for fabricating metal interconnections according to claim 9, wherein in the sixth step of removing the ground metal film by etching, the metal film deposited in the fourth step is used as an etching mask.

12. The method for fabricating metal interconnections according to claim 9, further comprising:

a seventh step for forming a surface metal film on the metal film in addition to the first to sixth steps.

13. The method for fabricating metal interconnections according to claim 9, wherein the ground metal film is formed of nickel.

14. The method for fabricating metal interconnections according to claim 9, wherein the noble metal film is formed of gold.

15. The method for fabricating metal interconnections according to claim 9, wherein the metal film is formed of copper.

16. An active matrix board comprising metal interconnections formed by using the fabrication method according to claim 9.

* * * * *